United States Patent
Wang et al.

(10) Patent No.: US 9,402,310 B2
(45) Date of Patent: Jul. 26, 2016

(54) LOW-DIELECTRIC RESIN COMPOSITION AND COPPER-CLAD LAMINATE AND PRINTED CIRCUIT BOARD USING THE SAME

(71) Applicant: Elite Electronic Material (KunShan) Co., Ltd., Kunshan (CN)

(72) Inventors: Rongtao Wang, Kunshan (CN); Chen Yu Hsieh, Tao-Yuan Hsien (TW); Wenjun Tian, Kunshan (CN); Ziqian Ma, Kunshan (CN); Wenfeng LV, Kunshan (CN)

(73) Assignee: Elite Electronic Material (Kunshan) Co., Ltd., Kunshan, Jiangsu Province (CN)

( * ) Notice: Subject to any disclaimer, the term of this patent is extended or adjusted under 35 U.S.C. 154(b) by 351 days.

(21) Appl. No.: 14/170,263

(22) Filed: Jan. 31, 2014

(65) Prior Publication Data

US 2015/0044485 A1 Feb. 12, 2015

(30) Foreign Application Priority Data

Aug. 9, 2013 (CN) .......................... 2013 1 0347853

(51) Int. Cl.
*B32B 27/00* (2006.01)
*H05K 1/03* (2006.01)

(52) U.S. Cl.
CPC ............ *H05K 1/0353* (2013.01); *H05K 1/0326* (2013.01); *H05K 2201/0158* (2013.01); *Y10T 428/31696* (2015.04)

(58) Field of Classification Search
CPC .................... H05K 1/0353; H05K 2201/0158; H05K 1/0326; Y10T 428/31696
USPC ......................................................... 428/462
See application file for complete search history.

(56) References Cited

U.S. PATENT DOCUMENTS

2009/0110938 A1* 4/2009 Nishimura .............. B32B 15/14
428/425.8

* cited by examiner

*Primary Examiner* — Eisa Elhilo
(74) *Attorney, Agent, or Firm* — Muncy, Geissler, Olds & Lowe, P.C.

(57) ABSTRACT

The present invention provides a resin composition useful for a copper-clad laminate and a printed circuit board, wherein the resin composition comprises the following components: (A) 100 parts by weight of vinyl-containing polyphenylene ether resin; (B) 5 to 50 parts by weight of maleimide; (C) 10 to 100 parts by weight of styrene-butadiene copolymer; and (D) 5 to 30 parts by weight of cyanate ester resin. The present invention also provides a resin composition and an article made therefrom having low dissipation factor at high frequency and excellent thermal resistance and peeling strength and being useful for a copper-clad laminate and a printed circuit board.

10 Claims, No Drawings

LOW-DIELECTRIC RESIN COMPOSITION AND COPPER-CLAD LAMINATE AND PRINTED CIRCUIT BOARD USING THE SAME

CROSS-REFERENCE TO RELATED APPLICATIONS

The current application claims a foreign priority to the patent application of China No. 201310347853.8 filed on Aug. 9, 2013.

FIELD OF THE INVENTION

This invention relates to a low-dielectric resin composition and more particularly to a low-dielectric resin composition useful for copper-clad laminates and printed circuit boards.

BACKGROUND OF THE INVENTION

With the rapid evolution of electronic technology, data processing of electronic products including mobile communication apparatuses, servers and mainframe computers has been continuously developed towards high frequency signal transmission and high speed digitalization, and low-dielectric resin materials have therefore become the mainstream for the development of laminates with a high transmission rate so as to meet the demands of high speed data processing.

Conventionally, resin compositions for copper-clad laminates generally use an epoxy resin crosslinked with a phenolic, amine or anhydride curing agent. However, these compositions fail to achieve a low dissipation factor (Df); in particular, Df is hardly lower than 0.009 and is even more difficult to reach 0.007 or lower at 10 GHz. In addition, desirable laminate thermal resistance and peeling strength between a laminate and a copper foil are difficult to attain at the same time.

For example, certain polyphenylene ether resin and certain cyanate ester resin have been used in combination in prior arts to obtain desirable processability, thermal resistance and solvent resistance, but such composition cannot satisfy the requirements of low dissipation factor. It has also been reported in prior arts to combine polyphenylene ether resin with other components to obtain a particular dissipation factor, thermal resistance and mechanical performance; however, the dissipation factor was usually measured or tested at 1 GHz or a lower frequency. In general, when the frequency gets higher, the dielectric constant will also become higher, which results in poorer dielectric properties. Accordingly, it would be desirable for those skilled in the art to obtain a low dissipation factor (Df) at 10 GHz while at the same time to maintain other properties, especially thermal resistance and peeling strength of the laminate, at an acceptable level.

Therefore, there is a need to provide a resin composition and an article made therefrom having low dissipation factor at high frequency and excellent thermal resistance and peeling strength and being useful for a copper-clad laminate and a printed circuit board.

SUMMARY OF THE INVENTION

It is a first object of this invention to obtain a resin composition having low dissipation factor at high frequency and excellent thermal resistance and peeling strength and being useful for a copper-clad laminate and a printed circuit board.

It is a second object of this invention to obtain an article made from resin, which includes a prepreg, said article having low dissipation factor at high frequency and excellent thermal resistance and peeling strength and being useful for a copper-clad laminate and a printed circuit board.

It is a third object of this invention to obtain a copper-clad laminate, which contains a prepreg having low dissipation factor at high frequency and excellent thermal resistance and peeling strength.

It is a fourth object of this invention to obtain a printed circuit board, which contains a copper-clad laminate having low dissipation factor at high frequency and excellent thermal resistance and peeling strength.

According to the first aspect of this invention, a resin composition is provided for application to a copper-clad laminate and a printed circuit board, the resin composition comprising the following components:

(A) 100 parts by weight of vinyl-containing polyphenylene ether resin;
(B) 5 to 50 parts by weight of maleimide;
(C) 10 to 100 parts by weight of styrene-butadiene copolymer; and
(D) 5 to 30 parts by weight of cyanate ester resin.

In one embodiment of this invention, a resin composition is provided for application to a copper-clad laminate and a printed circuit board, wherein the resin composition comprises the following components:

(A) 100 parts by weight of vinyl-containing polyphenylene ether resin;
(B) 10 to 45 parts by weight of maleimide;
(C) 10 to 50 parts by weight of styrene-butadiene copolymer; and
(D) 5 to 30 parts by weight of cyanate ester resin.

In one embodiment, a resin composition is provided for application to a copper-clad laminate and a printed circuit board, wherein the resin composition comprises the following components:

(A) 100 parts by weight of vinyl-containing polyphenylene ether resin;
(B) 5 to 50 parts by weight of maleimide;
(C) 10 to 100 parts by weight of styrene-butadiene copolymer;
(D) 5 to 30 parts by weight of cyanate ester resin; and
(E) 60 to 150 parts by weight of brominated flame retardant.

In one embodiment of this invention, the component (C) styrene-butadiene copolymer is styrene-butadiene-divinylbenzene copolymer.

In one embodiment of this invention, the component (C) styrene-butadiene copolymer is hydrogenated diene-butadiene-styrene copolymer.

In one embodiment of this invention, the styrene-butadiene-divinylbenzene copolymer comprises 25 to 30 mol % of styrene unit, 60 to 65 mol % of butadiene unit, and 5 to 15 mol % of divinylbenzene unit.

In one embodiment of this invention, the component (A) vinyl-containing polyphenylene ether resin is vinyl benzyl ether polyphenylene ether resin.

In one embodiment of this invention, the component (A) vinyl-containing polyphenylene ether resin is methacrylate-terminated bisphenol A-based polyphenylene ether resin, i.e. bisphenol A-based polyphenylene ether resin with a methacrylate end-group.

In one embodiment of this invention, the resin composition further comprises 30 to 200 parts by weight of inorganic filler.

In one embodiment of this invention, the resin composition further comprises any one of a curing accelerator, a coupling agent, a toughening agent and a solvent, or a combination thereof, wherein the content of each component is as follows:

curing accelerator: 0.001 to 5 parts by weight; coupling agent: 0.001 to 0.1 part by weight; toughening agent: 0.01 to 20 parts by weight; and solvent: 10 to 300 parts by weight.

According to the second aspect of this invention, an article made from the aforesaid resin composition is provided, wherein the article is a prepreg.

According to the third aspect of this invention, a copper-clad laminate is provided, which comprises the aforesaid prepreg.

In one preferred embodiment, the copper-clad laminate made from the resin composition of this invention has a Df<0.006@10 GHz, meaning that Df in 10 GHz frequency testing is lower than 0.006; S/D>5 min; and PS (half ounce copper foil)>4.5 lb/in, wherein S/D and PS are defined below.

According to the fourth aspect of this invention, a printed circuit board is provided, which comprises the aforesaid copper-clad laminate.

DETAILED DESCRIPTION OF THE INVENTION

As a result of extensive and thorough study by the inventors of this application to improve the foregoing conventional compositions, a low-dielectric resin composition was obtained, which has various desirable properties including dissipation factor (Df), thermal resistance and peeling strength of a laminate, and the present invention is completed on the basis of the resin composition.

As used herein, the terms "comprises," "comprising," "includes," "including," "has," "having" and any other variation thereof are intended to cover a non-exclusive inclusion. For example, a composition or article of manufacture that comprises a list of elements is not necessarily limited to only those elements but may include other elements not expressly listed or inherent to such composition or article of manufacture. Therefore, the terms "comprises," "comprising," "includes," "including," "has," and "having" indicate that various components may be used collectively in the mixture or composition of this invention. On the other hand, the terms "consisting essentially of" and "consisting of" include only the named components as well as other non-essential components which do not significantly affect the uses and effects of the present invention.

Unless otherwise specified, the term "alkyl" as used herein denotes a linear, branched, or cyclic hydrocarbon group having from 1 to 8 carbon atoms. Exemplary alkyl groups include but are not limited to methyl, ethyl, n-propyl, isopropyl, n-butyl, isobutyl, and tert-butyl.

Various aspects of the present invention are described in detail below.

Low-Dielectric Resin Composition

It is an object of this invention to provide a low-dielectric resin composition.

According to the first aspect of this invention, a resin composition is provided for application to a copper-clad laminate and a printed circuit board, the resin composition comprising the following components:

(A) 100 parts by weight of vinyl-containing polyphenylene ether resin;
(B) 5 to 50 parts by weight of maleimide;
(C) 10 to 100 parts by weight of styrene-butadiene copolymer; and
(D) 5 to 30 parts by weight of cyanate ester resin.

The inventors of this application have found that Dk and Df can both be lowered by the addition of polybutadiene, but polybutadiene is poorly compatible with other resins, such as cyanate ester resin, which means that a resin composition comprising the two components is prone to precipitation or separation into layers, requiring a prepolymerization process to overcome the compatibility problem; moreover, with the addition of polybutadiene into the resins, both S/D (solder dip test of a copper-containing laminate) and PS (peeling strength of copper foils) values are greatly lowered. The inventors of this application, with the use of a styrene-butadiene copolymer as a crosslinker, induced a reaction between the vinyl group of the structural unit with maleimide and polyphenylene ether, obtaining a desirable compatibility and laminate thermal resistance through the cooperation of multiple components in the composition. Therefore, the decrease of S/D and peeling strength of copper foils can be prevented, and the prepolymerization process can be eliminated. In this invention, styrene-butadiene-divinylbenzene copolymer is preferably used to achieve more desirable effects, i.e. better S/D and thermal resistance. Accordingly, this invention obtains a low-dielectric resin composition with excellence in all aspects of dissipation factor (Df), laminate thermal resistance, and peeling strength of copper foils.

Components (A) to (D) are active components of this invention, but a proper amount of other suitable substances such as additives or inert substances may also be included, as long as they do not cause substantial limitation to the purposes of the present invention.

Component (A) Vinyl-Containing Polyphenylene Ether Resin

In the resin composition of this invention, the component (A) vinyl-containing polyphenylene ether resin is not specifically limited. Generally, the component (A) vinyl-containing polyphenylene ether resin of this invention refers to a polyphenylene ether resin with an end group having an unsaturated double bond, such as a vinyl group, a carbon-carbon double bond or any other unsaturated double bond. Component (A) can be exemplified by any of the structures shown by formula (1) or (5), but not limited thereto:

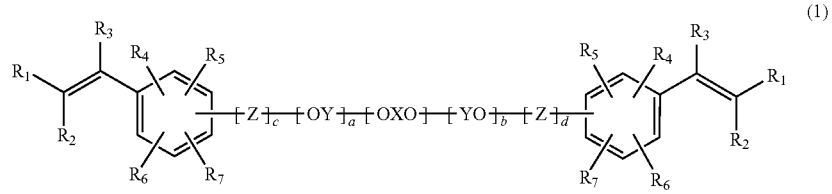

wherein $R_1$ and $R_2$ represent hydrogen atom; $R_3$, $R_4$, $R_5$, $R_6$ and $R_7$ are the same or different, each representing hydrogen atom, halogen atom, alkyl group or halogen-substituted alkyl group;

—(O—X—O)— represents any one of formula (2) or (3):

(2)

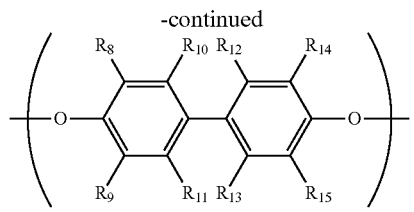
-continued
(3)

wherein $R_8$, $R_9$, $R_{14}$ and $R_{15}$ are the same or different, each representing halogen atom, alkyl group with 6 or less carbon atoms or phenyl group; $R_{10}$, $R_{11}$, $R_{12}$ and $R_{13}$ are the same or different, each representing hydrogen atom, halogen atom, alkyl group with 6 or less carbon atoms or phenyl group;

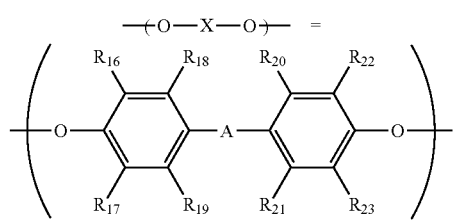

wherein $R_{16}$ to $R_{23}$ are the same or different, each representing halogen atom, alkyl group with 6 or less carbon atoms or phenyl group; A represents a linear, branched or cyclic hydrocarbon with 20 or less carbon atoms;

—(Y—O)— represents formula (4):

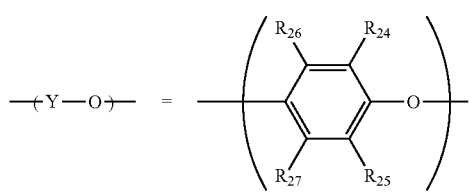
(4)

wherein $R_{24}$ and $R_{25}$ are the same or different, each representing halogen atom, alkyl group with 6 or less carbon atoms or phenyl group; $R_{26}$ and $R_{27}$ are the same or different, each representing hydrogen atom, halogen atom, alkyl group with 6 or less carbon atoms or phenyl group;

Z represents an organic group with at least one carbon atom, and the organic group may further contain an oxygen atom, a nitrogen atom, a sulfur atom and/or halogen atom; for example, Z may be a methylene (—CH$_2$—);

a and b individually represent an integer from 1 to 30; and c and d are 1.

The component (A) vinyl-containing polyphenylene ether resin may also be a methacrylate-terminated polyphenylene ether resin as shown in formula (5):

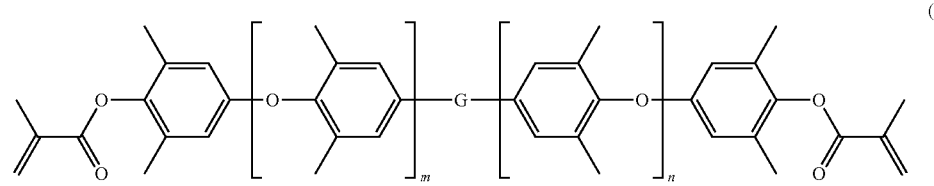
(5)

wherein G is bisphenol A, bisphenol F or a covalent bond; and m and n individually represent an integer of 1 to 15.

In the resin composition of this invention, the component (A) vinyl-containing polyphenylene ether resin is preferably selected from at least one of the following resins: methacrylate polyphenylene ether resin (e.g. SA-9000, commercially available from SABIC) and vinyl benzyl ether polyphenylene ether resin (e.g. OPE-2st, commercially available from Mitsubishi Gas Chemical Co., Inc.).

Most preferably, the component (A) vinyl-containing polyphenylene ether resin of this invention is vinyl benzyl ether polyphenylene ether resin, which has high compatibility with the component (C), such that a resin composition formed by a mixture of the two components can be prevented from precipitation or separation into layers.

The vinyl benzyl ether polyphenylene ether resin represents a polyphenylene ether resin containing

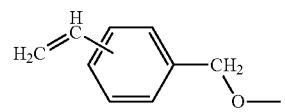

in its molecular structure.

Component (B) Maleimide

In the resin composition of this invention, the component (B) maleimide is not specifically limited.

The maleimide of this invention is preferably a multifunctional maleimide.

More preferably, the maleimide is selected from at least one of the following groups: 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide and 1,6-bismaleimide-(2,2,4-trimethyl) hexane.

Component (C) Styrene-Butadiene Copolymer

The inventors of this application, with the use of a styrene-butadiene copolymer as a crosslinker, induced a reaction between the vinyl group of the structural unit with maleimide and polyphenylene ether, obtaining a desirable compatibility and laminate thermal resistance without causing undesirable decrease of S/D (solder dip test of a copper-containing laminate) and peeling strength of copper foils. In contrast, the S/D and Df values of this invention are better than that of using maleic anhydride polybutadiene and acrylate polybutadiene, and the pre-reaction process can be eliminated. Preferably, this invention uses styrene-butadiene-divinylbenzene copolymer to obtain better effects, such as better T288 thermal resistance, which is defined below.

In the resin composition of this invention, the component (C) styrene-butadiene copolymer has an ordinary meaning as defined in the technical field of this invention and comprises a copolymer containing butadiene and styrene units; optionally, the copolymer may further include other polymerizable units such as hydrogenated diene, maleic anhydride-diene, isoprene, divinylbenzene, etc.

Exemplified copolymers including other polymerizable units comprise: hydrogenated diene-butadiene-styrene copolymer, maleic anhydride-diene-butadiene-styrene copolymer, styrene-butadiene-styrene copolymer, styrene-isoprene-styrene copolymer, styrene-butadiene-divinylbenzene copolymer and maleic anhydride-styrene-butadiene copolymer.

In one embodiment of this invention, the component (C) styrene-butadiene copolymer is styrene-butadiene-divinylbenzene copolymer.

In one embodiment of this invention, the component (C) styrene-butadiene copolymer is hydrogenated diene-butadiene-styrene copolymer.

Preferably, the styrene-butadiene copolymer has a number average molecular weight ranging from 3,000 to 7,000.

The "styrene-butadiene copolymer" and preferable "styrene-butadiene-divinylbenzene copolymer" are both commercially available, such as Ricon-257 from Sartomer or SEBS H-1052 from Asahi Kasei Corp.

In one embodiment of this invention, the styrene-butadiene-divinylbenzene copolymer comprises 25 to 30 mol % of styrene unit, 60 to 65 mol % of butadiene unit, and 5 to 15 mol % of divinylbenzene unit.

Component (D) Cyanate Ester Resin

The inventors of this application have found that, compared with triallyl isocyanurate (TAIC), the use of cyanate ester increases the S/D (solder dip test of a copper-containing laminate) value of the composition.

In the resin composition of this invention, the component (D) cyanate ester resin has an ordinary meaning as defined in the technical field of this invention, i.e. a compound with a —O—C≡N structure, and includes without limitation: 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, cyanate ester resins prepared from dicyclopentadiene-phenol copolymers, etc. Examples include BA-230S, BA-3000S, BTP-6020S and other cyanate ester resins available from Lonza.

Other Components

In one preferred embodiment, a resin composition is provided for application to a copper-clad laminate and a printed circuit board, the resin composition comprising the following components:

(A) 100 parts by weight of vinyl-containing polyphenylene ether resin;

(B) 5 to 50 parts by weight of maleimide;

(C) 10 to 100 parts by weight of styrene-butadiene copolymer;

(D) 5 to 30 parts by weight of cyanate ester resin; and (E) 60 to 150 parts by weight of brominated flame retardant.

The inventors have found that, compared with phosphorous-containing flame retardants, the use of brominated flame retardants provides a better storage modulus.

In the resin composition of this invention, the component (E) brominated flame retardant is not specifically limited and preferably selected from at least one of the following flame retardants: ethylene-bis(tetrabromophthalimide) (e.g. SAYTEX BT-93, commercially available from Albemarle), 1,2-bis(pentabromophenyl)ethane (e.g. SAYTEX 8010, commercially available from Albemarle), and 2,4,6-tris(2,4,6-tribromophenoxy)-1,3,5-triazine (e.g. FR-245, commercially available from ICL Industrial Products).

In one embodiment of this invention, the composition further comprises 30 to 200 parts by weight of inorganic filler. The inorganic filler may comprise silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride and calcined kaolin. Moreover, the inorganic filler can be spherical, fibrous, plate-like, particulate, sheet-like or whisker-like and can be optionally pretreated by a silane coupling agent.

As stated above, this invention can further comprise a proper amount of suitable additives or inert substances, as long as they do not cause substantial limitation to the purposes of the present invention.

The resin composition of this invention can further comprise any one of a curing accelerator, a coupling agent, a toughening agent and a solvent, or a combination thereof.

The curing accelerator used in this invention may comprise catalysts, such as a Lewis base or a Lewis acid, wherein the Lewis base may comprise any one or more of imidazole, boron trifluoride-amine complex, ethyltriphenyl phosphonium chloride, 2-methylimidazole (2MI), 2-phenyl-1H-imidazole (2PI), 2-ethyl-4-methylimidazole (2E4MI), triphenylphosphine (TPP) and 4-dimethylaminopyridine (DMAP), and the Lewis acid may comprise metal salt compounds, such as those of manganese, iron, cobalt, nickel, copper and zinc, such as zinc octanoate or cobalt octanoate.

The coupling agent of this invention may comprise silane compounds and siloxane compounds, which may be further categorized according to the functional groups into amino silane compounds, amino siloxane compounds, epoxy silane compounds, and epoxy siloxane compounds.

The toughening agent of this invention may be selected from rubber resin, carboxyl-terminated butadiene acrylonitrile rubber (CTBN rubber), core-shell rubber, etc.

Solvents useful for this invention are not specifically limited, as long as they do not cause substantial limitation to the purposes of the present invention.

Article Made from Resin

According to the second aspect of this invention, an article made from the aforesaid resin composition is provided.

Another object of this invention is to provide a prepreg, which may comprise a reinforcement material and the aforesaid resin composition.

Another object of this invention is to provide a copper-clad laminate, which comprises two or more copper foils and at least one aforesaid prepreg.

In a preferred embodiment, the copper-clad laminate has a Df<0.006@10 GHz, meaning that Df at 10 GHz frequency is lower than 0.006; S/D>5 min; and PS (half ounce copper foil)>4.5 lb/in.

Another object of this invention is to provide a printed circuit board, which comprises the aforesaid copper-clad laminate.

As a result of extensive research, the inventors of this application have found a solution to keep the dissipation factor (Df) low even at 10 GHz and at the same time to maintain other properties, especially laminate thermal resistance and peeling strength of copper foils, at an acceptable level, thereby obtaining a copper-clad laminate and a printed circuit board with excellent performance.

Unless otherwise specified, the starting materials of the present invention may be commercially available or prepared by conventional methods known in the art. Unless otherwise defined or specified, all technical and scientific terms used herein have the meanings known by those skilled in the art. In addition, any process or material similar or equivalent to those cited herein may be used in the invention.

Without causing substantial limitation to the purposes of the present invention, other processes and materials already known in the art may all be useful for other aspects of this invention, and further description thereof is omitted for convenience.

While the present invention will be further illustrated in conjunction with the following embodiments, it will be understood that they are exemplary only and are not intended to limit the scope of the present invention. In the examples and embodiments below, experimental processes without specified conditions are usually carried out according to national standards; if there is not a corresponding national standard, commonly acceptable international standards, routine conditions or conditions proposed by manufacturers are followed. In addition, unless otherwise noted, all parts and percentages are by weight, and the molecular weight of a polymer is a number average molecular weight.

To fully illustrate its purposes, features and effects, the present invention is described in detail through the examples and embodiments below.

Test Methods

The above-mentioned copper-containing laminates and copper-free laminates formed after etching copper foil were subjected to physical property testing. Items tested include solder dip test of copper-containing laminates (solder dip, S/D, 288° C., time to blistering or delamination recorded; the testing process comprises placing a laminate on a 288° C. soldering surface, observing the surface of the laminate in contact with the solder every 30 seconds, and recording the time blistering or delamination occurs); bonding strength between copper foils and laminates (peeling strength, measured by a tensile strength tester, P/S, half ounce copper foil; low peeling strength between copper foils and laminates is undesirable); dielectric constant (Dk; measuring the Dk value of copper-free laminates with an AET's microwave dielectrometer; low Dk is more preferable); dissipation factor (Df; measuring the Df value of copper-free laminates with an AET's microwave dielectrometer; low Df is more preferable); flame retardancy (flaming test, UL94, wherein V-0 is superior than V-1); thermal resistance (T288, measured by a thermomechanical analyzer, TMA, in which the duration of a copper-containing laminate sustaining heat under 288° C. without blistering or delamination is recorded); and storage modulus (measured by a dynamic mechanical analyzer, DMA).

Materials

Commercially available materials are as follows:

OPE-2st: vinyl benzyl ether polyphenylene ether resin, commercially available from Mitsubishi Gas Chemical Co., Inc.;

SA-9000: methacrylate-terminated bisphenol A-based polyphenylene ether resin, commercially available from SABIC;

SA-90: bifunctional hydroxyl-terminated bisphenol A-based polyphenylene ether resin, commercially available from SABIC;

KI-80: 2,2'-bis[4-(4-maleimidephenoxy)phenyl]propane resin, commercially available from KI Chemical;

SEBS H-1052: hydrogenated diene-butadiene-styrene copolymer, commercially available from Asahi Kasei Corp.;

RB810: polybutadiene rubber, commercially available from JSR;

Ricon 257: styrene-butadiene-divinylbenzene copolymer, commercially available from Cray Valley;

BTP-6020S: cyanate ester resin, commercially available from Lonza;

SAYTEX 8010:1,2-bis(pentabromophenyl)ethane, commercially available from Albemarle Corporation;

SAYTEX BT-93: ethylene-bis(tetrabromophthalimide), commercially available from Albemarle Corporation;

FR-245: 2,4,6-tris(2,4,6-tribromophenoxy)-1,3,5-triazine, commercially available from ICL Industrial Products;

TBBPA: tetrabromobisphenol A, commercially available from Kingyorker Enterprise Co. Ltd.;

DBS: dibromostyrene, commercially available from Kingyorker Enterprise Co. Ltd.;

SPB-100: phosphazene compound, commercially available from Otsuka Chemical Co. Ltd.;

PX-200: condensed phosphate ester, commercially available from Daihachi Chemical Industry Co. Ltd.;

Fused silica: commercially available from Sibelco;

25B: 2,5-dimethyl-2,5-di(tert-butylperoxy)-3-hexyne, commercially available from NOF Corporation.

EXAMPLES

Resin compositions of Examples 1 to 13 and Comparative Examples 1 to 16 listed in Tables 1, 3, 5 and 6 were well mixed in a stirring tank separately and then placed in an impregnation tank, and fiberglass clothes were individually passed through the impregnation tank to impregnate the fiberglass clothes with the resin compositions, followed by heating to a semi-cured state to obtain prepregs.

From the prepregs prepared batchwise above, four prepregs from the same batch were covered by two 18 μm copper foils from the top and bottom and subjected to a lamination process under vacuum at 200° C. for 2 hours to form a copper-clad laminate, in which the four prepregs were cured to form the insulation layers between the two copper foils.

The copper-containing laminates obtained above and copper-free laminates formed after etching copper foil were subjected to physical property testing. Items tested include peeling strength of copper foils, thermal resistance of copper-containing laminates (T288), dielectric constant (lower Dk is preferable), dissipation factor (lower Df is preferable), flame retardancy and storage modulus.

TABLE 1

Composition of Examples 1 to 9

| | Components | E1 | E2 | E3 | E4 | E5 | E6 | E7 | E8 | E9 |
|---|---|---|---|---|---|---|---|---|---|---|
| Vinyl-containing polyphenylene ether | OPE-2st | 100 | 100 | 100 | 100 | 100 | 100 | 100 | 100 | 50 |
| | SA-9000 | 0 | 0 | 0 | 0 | 0 | 0 | 0 | 0 | 50 |
| Maleimide | KI-80 | 25 | 5 | 50 | 25 | 25 | 25 | 25 | 25 | 25 |
| Styrene-butadiene copolymer | SEBS H-1052 | 50 | 50 | 50 | 10 | 100 | 50 | 50 | 50 | 0 |
| | Ricon 257 | 0 | 0 | 0 | 0 | 0 | 0 | 0 | 0 | 60 |
| Cyanate ester resin | BTP-6020S | 15 | 15 | 15 | 15 | 15 | 5 | 30 | 15 | 30 |
| Brominated flame retardant | SAYTEX 8010 | 80 | 80 | 80 | 80 | 80 | 80 | 80 | 40 | 80 |
| | SAYTEX BT-93 | 0 | 0 | 0 | 0 | 0 | 0 | 0 | 40 | 0 |
| Filler | Fused silica | 100 | 100 | 100 | 100 | 100 | 100 | 100 | 100 | 100 |
| Accelerator | 25B | 3 | 3 | 3 | 3 | 3 | 3 | 3 | 3 | 3 |
| Solvent | Toluene | 200 | 200 | 200 | 200 | 200 | 200 | 200 | 200 | 200 |

TABLE 2

Test Results of Examples 1 to 9

| Property | Condition | E1 | E2 | E3 | E4 | E5 | E6 | E7 | E8 | E9 |
|---|---|---|---|---|---|---|---|---|---|---|
| Peeling strength | lb/in | 5.53 | 5.18 | 5.60 | 5.50 | 4.84 | 5.34 | 5.61 | 5.53 | 4.56 |
| S/D | dip 288° C. | >5 min | >5 min | >5 min | >5 min | 5 min | >5 min | >5 min | >5 min | 5 min |
| Dk | 10 GHz | 3.75 | 3.78 | 3.8 | 3.78 | 3.68 | 3.78 | 3.79 | 3.82 | 3.73 |
| Df | 10 GHz | 0.0057 | 0.0055 | 0.0058 | 0.0059 | 0.0053 | 0.0056 | 0.0056 | 0.0057 | 0.0060 |
| Flame retardancy | UL-94 | V-0 | V-0 | V-0 | V-0 | V-0 | V-0 | V-0 | V-0 | V-0 |

TABLE 3

Composition of Comparative Examples 1 to 12

| | Components | C1 | C2 | C3 | C4 | C5 | C6 | C7 | C8 | C9 | C10 | C11 | C12 |
|---|---|---|---|---|---|---|---|---|---|---|---|---|---|
| Polyphenylene ether resin | OPE-2st | 100 | 100 | 100 | 100 | 100 | 100 | 100 | 100 | 100 | 100 | 0 | 100 |
| | SA-90 | 0 | 0 | 0 | 0 | 0 | 0 | 0 | 0 | 0 | 0 | 100 | 0 |
| Maleimide | KI-80 | 2 | 60 | 25 | 25 | 25 | 25 | 25 | 25 | 25 | 25 | 25 | 25 |
| Styrene-butadiene copolymer | SEBS H-1052 | 50 | 50 | 2 | 105 | 50 | 50 | 50 | 50 | 50 | 50 | 50 | 0 |
| Polybutadiene rubber | RB810 | 0 | 0 | 0 | 0 | 0 | 0 | 0 | 0 | 0 | 0 | 0 | 50 |
| Cyanate ester resin | BTP-6020S | 15 | 15 | 15 | 15 | 0 | 40 | 15 | 15 | 15 | 15 | 15 | 15 |
| Brominated flame retardant | SAYTEX 8010 | 80 | 80 | 80 | 80 | 80 | 80 | 30 | 180 | 80 | 80 | 80 | 80 |
| Filler | Fused silica | 100 | 100 | 100 | 100 | 100 | 100 | 100 | 100 | 10 | 250 | 100 | 100 |
| Accelerator | 25B | 3 | 3 | 3 | 3 | 3 | 3 | 3 | 3 | 3 | 3 | 3 | 3 |
| Solvent | Toluene | 200 | 200 | 200 | 200 | 200 | 200 | 200 | 200 | 200 | 200 | 200 | 200 |

TABLE 4

Test Results of Comparative Examples 1 to 12

| Property | Condition | C1 | C2 | C3 | C4 | C5 | C6 | C7 | C8 | C9 | C10 | C11 | C12 |
|---|---|---|---|---|---|---|---|---|---|---|---|---|---|
| Peeling strength | lb/in | 4.33 | 5.67 | 5.56 | 4.01 | 4.14 | 5.66 | 5.12 | 4.25 | 5.75 | 4.39 | 4.36 | 2.45 |
| S/D | dip 288° C. | 3 min | >5 min | 5 min | 3 min | 2 min | 4 min | >5 min | 4 min | >5 min | >5 min | >5 min | 1 min |
| Dk | 10 GHz | 3.78 | 3.85 | 3.98 | 3.58 | 3.85 | 3.8 | 3.74 | 3.72 | 3.78 | 3.98 | 3.85 | 3.83 |
| Df | 10 GHz | 0.0055 | 0.0066 | 0.0063 | 0.0053 | 0.0056 | 0.0061 | 0.0057 | 0.0058 | 0.0067 | 0.0056 | 0.0084 | 0.0060 |

TABLE 4-continued

Test Results of Comparative Examples 1 to 12

| Property | Condition | C1 | C2 | C3 | C4 | C5 | C6 | C7 | C8 | C9 | C10 | C11 | C12 |
|---|---|---|---|---|---|---|---|---|---|---|---|---|---|
| Flame retardancy | UL-94 | V-0 | V-0 | V-0 | V-0 | V-0 | V-0 | V-1 | V-0 | V-1 | V-0 | V-0 | V-0 |

TABLE 5

Composition and Test Results of Examples 9 and 10

| | Components | E9 | E10 |
|---|---|---|---|
| Vinyl-containing polyphenylene ether | OPE-2st | 50 | 50 |
| | SA-9000 | 50 | 50 |
| Maleimide | KI-80 | 25 | 25 |
| Styrene-butadiene copolymer | SEBS H-1052 | 0 | 60 |
| | Ricon 257 | 60 | 0 |
| Cyanate ester resin | BTP-6020S | 30 | 30 |
| Brominated flame retardant | SAYTEX 8010 | 80 | 80 |
| | SAYTEX BT-93 | 0 | 0 |
| Filler | Fused silica | 100 | 100 |
| Accelerator | 25B | 3 | 3 |
| Solvent | Toluene | 200 | 200 |
| T288 thermal resistance test of copper-containing laminate | TMA/min | >70 | 43 |

TABLE 6

Composition and Test Results of Examples 11 to 13 and Comparative Examples 13 to 16

| | Components | E11 | E12 | E13 | C13 | C14 | C15 | C16 |
|---|---|---|---|---|---|---|---|---|
| Vinyl containing polyphenylene ether | OPE-2st | 100 | 100 | 100 | 100 | 100 | 100 | 100 |
| Maleimide | KI-80 | 25 | 25 | 25 | 25 | 25 | 25 | 25 |
| Styrene butadiene copolymer | SEBS H-1052 | 50 | 50 | 50 | 50 | 50 | 50 | 50 |
| Cyanate ester resin | BTP-6020S | 15 | 15 | 15 | 15 | 15 | 15 | 15 |
| Flame retardant | SAYTEX 8010 | 80 | 0 | 0 | 0 | 0 | 0 | 0 |
| | SAYTEX BT-93 | 0 | 80 | 0 | 0 | 0 | 0 | 0 |
| | FR-245 | 0 | 0 | 80 | 0 | 0 | 0 | 0 |
| | TBBPA | 0 | 0 | 0 | 80 | 0 | 0 | 0 |
| | DBS | 0 | 0 | 0 | 0 | 80 | 0 | 0 |
| | PX-200 | 0 | 0 | 0 | 0 | 0 | 80 | 0 |
| | SPB-100 | 0 | 0 | 0 | 0 | 0 | 0 | 80 |
| Filler | Fused silica | 100 | 100 | 100 | 100 | 100 | 100 | 100 |
| Accelerator | 25B | 3 | 3 | 3 | 3 | 3 | 3 | 3 |
| Solvent | Toluene | 200 | 200 | 200 | 200 | 200 | 200 | 200 |
| Storage modulus | DMA/Gpa | 13.5 | 14 | 12.5 | 10 | 10.5 | 8 | 9.4 |

The inventors of this application have found that Dk and Df can be lowered by the addition of polybutadiene, but polybutadiene is poorly compatible with other resins, such as cyanate ester resin, such that both S/D and peeling strength of copper foils (PS) of the resin composition will be greatly lowered after the addition of polybutadiene, requiring a pre-polymerization process to overcome the compatibility problem.

As illustrated by Comparative Example C12, generally S/D and peeling strength of copper foils (PS) of the resin composition will be greatly lowered after the addition of polybutadiene.

As shown in Examples E1 to E9, the inventors of this application, with the use of a styrene-butadiene copolymer as a crosslinker, induced a reaction between the vinyl group of the structural unit with maleimide and polyphenylene ether, obtaining a desirable compatibility and laminate thermal resistance, without causing undesirable decrease of S/D and peeling strength of copper foils, and eliminating the necessity of a pre-reaction process.

As shown in Examples E9 and E10, this invention preferably uses styrene-butadiene-divinylbenzene copolymer to achieve a better thermal resistance of the laminate (T288).

Because the content of a certain component in Comparative Examples C1 to C10 is not within the range specified by this invention, each of C1 to C10 fails to meet the requirements of Df, S/D, PS and flame retardancy at the same time. Through the comparison with Example E1, Comparative Example C11, which uses polyphenylene ether not containing a vinyl group, has a rather high Df value and weaker peeling strength of copper foils.

In addition, the resin compositions of this invention may use a bromine-containing flame retardant (E11 to E13), which provides a better storage modulus than those using a phosphorous-containing flame retardant (C13 to C16).

Accordingly, this invention has obtained a low-dielectric resin composition with excellence in all aspects of dissipation factor (Df), laminate thermal resistance, and peeling strength of copper foils.

The above detailed description is merely illustrative of the preferred embodiments of this invention and is not intended to limit the scope of this invention, which is broadly defined by the claims set forth below. Technical solutions, implementations or processes accomplished by others will be considered to fall within the scope of the claims if they are completely identical to those defined in the appended claims or are equivalent modifications of this invention.

All references cited in this invention are incorporated by reference in their entirety, as if they were referenced individually. In addition, it is understood that after reading this specification, skilled artisans appreciate that various changes and modifications are possible, but these equivalents shall also fall within the scope of the appended claims.

What is claimed is:

1. A resin composition comprising the following components:
   (A) 100 parts by weight of vinyl-containing polyphenylene ether resin;
   (B) 5 to 50 parts by weight of maleimide;
   (C) 10 to 100 parts by weight of styrene-butadiene copolymer; and
   (D) 5 to 30 parts by weight of cyanate ester resin.

2. The resin composition of claim 1, wherein the styrene-butadiene copolymer is hydrogenated diene-butadiene-styrene copolymer, styrene-butadiene-divinylbenzene copolymer, or a combination thereof.

3. The resin composition of claim 2, wherein the styrene-butadiene-divinylbenzene copolymer comprises 25 to 30 mol % of styrene unit, 60 to 65 mol % of butadiene unit, and 5 to 15 mol % of divinylbenzene unit.

4. The resin composition of claim 1, wherein the vinyl-containing polyphenylene ether resin is methacrylate-terminated bisphenol A-based polyphenylene ether resin, vinyl benzyl ether polyphenylene ether resin, or a combination thereof.

5. The resin composition of claim 1, further comprising 60 to 150 parts by weight of brominated flame retardant.

6. The resin composition of claim 1, further comprising 30 to 200 parts by weight of inorganic filler.

7. The resin composition of claim 1, further comprising any one of a curing accelerator, a coupling agent, a toughening agent and a solvent, or a combination thereof.

8. A prepreg made from the resin composition of claim 1.

9. A copper-clad laminate comprising the prepreg of claim 8.

10. A printed circuit board comprising the copper-clad laminate of claim 9.

* * * * *